(12) United States Patent
Song et al.

(10) Patent No.: US 10,629,639 B2
(45) Date of Patent: Apr. 21, 2020

(54) WIRE INCLUDING ORGANIC LAYER, DISPLAY DEVICE INCLUDING THE SAME AND METHOD OF MANUFACTURING THE SAME

(71) Applicant: Samsung Display Co., Ltd., Yongin-si, Gyeonggi-do (KR)

(72) Inventors: Do Keun Song, Yongin-si (KR); Gyung Min Baek, Yongin-si (KR); Sang Won Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/035,901

(22) Filed: Jul. 16, 2018

(65) Prior Publication Data
US 2019/0148419 A1 May 16, 2019

(30) Foreign Application Priority Data
Nov. 16, 2017 (KR) .................. 10-2017-0153075

(51) Int. Cl.
*G02F 1/1362* (2006.01)
*G02F 1/1368* (2006.01)
(Continued)

(52) U.S. Cl.
CPC .... *H01L 27/1288* (2013.01); *G02F 1/136209* (2013.01); *H01L 21/32139* (2013.01);
(Continued)

(58) Field of Classification Search
CPC .. G02F 1/136; G02F 1/136286; G02F 1/1368; G02F 1/133345; G02F 1/136227; G02F 1/134309; G02F 1/133512; G02F 1/13439; G02F 1/1362; G02F 1/136209; G02F 1/1333; G02F 1/1343; G02F 1/1337; G02F 2201/123; G02F 2001/136295; G02F 2001/13629; G02F 2001/13685; G02F 2202/02; H01L 27/124; H01L 27/1262; H01L 27/1288; H01L 27/3276; H01L 27/3262; H01L 27/3248; H01L 27/3272; H01L 29/786; H01L 29/4908;
(Continued)

(56) References Cited

U.S. PATENT DOCUMENTS

| 6,909,477 | B1 * | 6/2005 | Yi | G02F 1/136209 349/106 |
| 2006/0027860 | A1 * | 2/2006 | Nomoto | H01L 51/0021 257/327 |
| 2016/0204126 | A1 * | 7/2016 | Amano | H01L 29/78693 257/59 |

FOREIGN PATENT DOCUMENTS

| KR | 19980026049 A | 7/1998 |
| KR | 0161115 B1 | 8/1998 |

(Continued)

*Primary Examiner* — Thoi V Duong
(74) *Attorney, Agent, or Firm* — Cantor Colburn LLP

(57) ABSTRACT

A display device includes: a thin film transistor to which signals are provided for displaying an image, the thin film transistor including a semiconductor layer, a data signal line and a gate signal line; and a first electrode with which the image is displayed, the first electrode connected to the thin film transistor. One signal line among the data signal line and the gate signal line in the thin film transistor includes a metal layer and an organic layer which is disposed on the metal layer, and the organic layer is an ion-doped photosensitive resin material.

9 Claims, 12 Drawing Sheets

(51) Int. Cl.
*H01L 27/12* (2006.01)
*H01L 27/32* (2006.01)
*H01L 51/52* (2006.01)
*H01L 21/3213* (2006.01)
*H01L 21/3115* (2006.01)
*H01L 21/3105* (2006.01)

(52) U.S. Cl.
CPC ........ *H01L 27/124* (2013.01); *H01L 27/1248* (2013.01); *H01L 27/1262* (2013.01); *H01L 27/3276* (2013.01); *H01L 51/5284* (2013.01); *G02F 1/1368* (2013.01); *H01L 21/31058* (2013.01); *H01L 21/31155* (2013.01); *H01L 27/3272* (2013.01)

(58) Field of Classification Search
CPC ......... H01L 29/41733; H01L 29/78669; H01L 29/458; H01L 29/4958; H01L 29/4966; H01L 23/49838; H01L 21/28; H01L 21/283; H01L 21/31058; H01L 21/31155; H01L 51/0018; H01L 51/052; H01L 51/5284; G09G 2300/0426
See application file for complete search history.

(56) References Cited

FOREIGN PATENT DOCUMENTS

| KR | 1020160021342 A | 2/2016 |
| KR | 101707438 B1 | 2/2017 |

* cited by examiner

WIRE INCLUDING ORGANIC LAYER, DISPLAY DEVICE INCLUDING THE SAME AND METHOD OF MANUFACTURING THE SAME

This application claims priority to Korean Patent Application No. 10-2017-0153075 filed on Nov. 16, 2017, and all the benefits accruing therefrom under 35 U.S.C. § 119, the entire contents of which are incorporated herein by reference.

BACKGROUND (a) Field

The present disclosure relates to a display device and a manufacturing method of wires used in the display device, and more particularly, to a display device including wires with reduced external light reflection and a manufacturing method of these wires.

(b) Description of the Related Art

Typically, a liquid crystal display, which is a display device using a characteristic of liquid crystal molecules having different arrangements depending on voltage application, may be driven at lower electric power than that of a cathode ray tube. The liquid crystal display is also advantageous in downsizing and thinning thereof. Therefore, the liquid crystal display is attracting attention as a next-generation display device for a laptop computer or a wall-mounted television.

The liquid crystal display is roughly divided into a liquid crystal panel and a backlight unit which supplies light to the liquid crystal display from a back side thereof. The liquid crystal panel includes a lower substrate in which a thin film transistor is disposed and an upper substrate in which a color filter is disposed, and a liquid crystal layer is disposed between the lower substrate and the upper substrate.

In this case, a black matrix is positioned in the upper substrate in which the color filter is formed. The black matrix is used to block leakage of light (supplied from the backlight unit) in a non-uniform liquid crystal driving region in a pixel area of the liquid crystal display and to block reflection of surfaces of metal wires disposed in the lower substrate from external light introduced thereto.

SUMMARY

Exemplary embodiments have been made in an effort to provide a display device including wires with reduced external light reflection, and a manufacturing method of these wires.

An exemplary embodiment of the invention provides a display device including: a thin film transistor to which signals are provided for displaying an image, the thin film transistor including a semiconductor layer, a data signal line and a gate signal line; and a first electrode being connected to the thin film transistor. One signal line among the data signal line and the gate signal line in the thin film transistor includes a metal layer and an organic layer which is disposed on the metal layer, and the organic layer within the one signal line is an ion-doped photosensitive resin material.

The doped ions of the organic layer within the one signal line may include at least one of phosphorous, boron, antimony, arsenic, gold, iron, copper, lithium, zinc, manganese, magnesium, nickel, sodium, silicon, cobalt, tin, zirconium and silver ions.

A thickness of the organic layer within the one signal line may be in a range of about 1 angstrom (Å) to about 10 micrometers (μm).

The organic layer within the one signal line may have an opaque color.

The organic layer within the one signal line may have a black color.

A concentration of doped ions of the organic layer within the one signal line may different in an entire region of the organic layer.

The ion-doped photosensitive resin material of the organic layer within the one signal line may include nanoparticles.

The display device may further include: a first display substrate in which are disposed the first electrode and the thin film transistor including the one signal line including the metal layer and the organic layer thereon; a second display substrate facing the first display substrate; a second electrode in the second display substrate; and a liquid crystal layer between the first electrode and the second electrode.

The display device may further include a first substrate on which are disposed: the thin film transistor including the one signal line including the metal layer and the organic layer thereon; the first electrode connected to the thin film transistor, an emission layer on the first electrode; and a second electrode overlapping the first electrode with the emission layer therebetween.

An exemplary embodiment of the invention provides a wire forming method including: forming a metal layer on a substrate; applying a photosensitive resin material onto the metal layer; patterning the photosensitive resin material on the metal layer; etching the metal layer by using the patterned photosensitive resin material as a mask to form a patterned metal layer; and ion doping the patterned photosensitive resin material on the patterned metal layer to form the wire including the patterned metal layer and an ion-doped patterned photosensitive resin material thereon.

The method may further include between the etching of the metal layer by using the patterned photosensitive resin material as the mask and the ion doping of the patterned photosensitive resin material on the patterned metal layer, reducing a thickness of the patterned photosensitive resin material on the patterned metal layer.

The ion doping of the patterned photosensitive resin material on the patterned metal layer may be performed through ion implantation, and doped ions of the ion-doped patterned photosensitive resin material may include at least one of phosphorous, boron, antimony, arsenic, gold, iron, copper, lithium, zinc, manganese, magnesium, nickel, sodium, silicon, cobalt, tin, zirconium and silver ions.

A color of the patterned photosensitive resin material may be changed after the ion doping thereof.

A thickness of the patterned photosensitive resin material which is on the patterned metal layer may be in a range of about 1 Å to about 10 μm.

A color of the patterned photosensitive resin material may be changed by the ion doping thereof to form the ion-doped patterned photosensitive resin material having an opaque color.

A color of the patterned photosensitive resin material may be changed by the ion doping thereof to form the ion-doped patterned photosensitive resin material having black color.

A concentration of doped ions within the ion-doped patterned photosensitive resin material within the wire may different in an entire region of the organic layer.

The photosensitive resin material may include nanoparticles thereinside.

According to one or more exemplary embodiment, a display device is provided including wires with reduced external light reflection, and a manufacturing method of these wires is provided having a simplified process.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
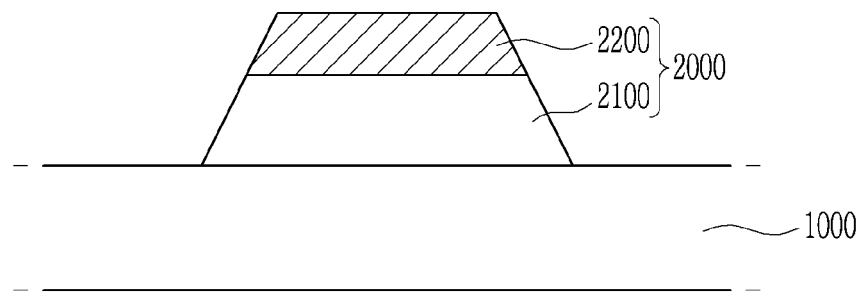
FIG. 1 is a cross-sectional view of an exemplary embodiment of a substrate and a wire in a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, in the specification, the phrase "in a plan view" means when an object portion is viewed from above, and the phrase "in a cross-section" means when a cross-section taken by vertically cutting an object portion is viewed from the side.

Hereinafter, exemplary embodiments of a display device according to the invention will be described with reference to the accompanying drawings.

The display device according to one or more exemplary embodiment of the invention includes a (base) substrate, a gate (signal) line positioned on the substrate, a switching element such as a thin film transistor including a portion of a data (signal) line and a semiconductor layer, and a first (display) electrode connected with the thin film transistor. In the display device, at least one wire among the gate line and the data line includes a metal (material) layer and an organic layer disposed on the metal layer, where the organic layer within the wire is an ion-doped photosensitive resin composition.

In other words, in the display device according to one or more exemplary embodiment of the invention, a wire included in the display device includes an organic layer, and the organic layer is an ion-doped photosensitive resin composition such as an ion-doped photosensitive resin material. As a result, wire reflection of a finally-formed wire may be reduced by performing ion-doping during a wire forming operation without removing the photosensitive resin composition used in such wire forming operation.

FIG. 1 is a cross-sectional view of an exemplary embodiment of a substrate 1000 and a wire 2000 used in a display device according to the invention. Referring to FIG. 1, the wire 2000 includes a metal layer 2100 and an organic layer 2200 which is disposed on the metal layer 2100.

The display device and components thereof may be disposed in a plane defined by a first direction and a second direction which cross each other. The first or second direction may be represented by the horizontal direction in FIG. 1. A thickness of the display device and components thereof is taken in a third direction which crosses each of the first and second directions. The third (thickness) direction is represented by the vertical direction in FIG. 1.

The metal layer 2100 may include any of a number of metal materials used for a wire. The metal layer 2100 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). In addition, the metal layer 2100 may have a multi-layered structure. In this case, metal layer 2100 may include a transparent conductive oxide such as indium tin oxide ("ITO"), gallium zinc oxide ("GZO"), and indium zinc oxide ("IZO"). In an exemplary embodiment, for example, the metal layer 2100 may have a multi-layered structure of molybdenum/aluminum/molybdenum, titanium/aluminum/titanium, or titanium/copper The organic layer 2200 includes an ion-doped photosensitive resin material or composition. In this case, the photosensitive resin composition may be a positive photosensitive resin composition or a negative photosensitive resin composition.

In detail, the photosensitive resin composition may include at least one of 2-methoxy-1-methylethylacetate, novolac resin, ethyl-3-ethoxypropionate, benzyl alcohol, cresol novolac resin, diazonaphthoquinone sulfonic ester, phenolic polyol, a polyhydroxy styrene derivative, propylene glycol methyl ether acetate, ethyl-3-ethoxypropionate, 2,3,4,4'tetrahydroxybenzophenone 1,2-naphthoquinonediazide-5-sulfonate, a photoactivator, and an additive. In an exemplary embodiment, for example, the photosensitive resin composition may include 2-methoxy-1-methylethylacetate, novolac resin, a photoactivator, and an additive, but it is not limited thereto.

This photosensitive resin composition is generally transparent. However, according to the one or more exemplary embodiment, the photosensitive resin composition included in the finally-formed wire 2000 is not transparent and has a certain color due to doping thereof with ions.

In other words, the photosensitive resin composition included in the organic layer 2200 is ion-doped. In this case, the doped ions may include at least one of phosphorous, boron, antimony, arsenic, gold, iron, copper, lithium, zinc, manganese, magnesium, nickel, sodium, silicon, cobalt, tin, zirconium, and silver ions. However, the invention is not limited thereto, and the doped ions may include metal, non-metal, or metalloid ions. A concentration of the doped ions of the organic layer 2200 within the wire is different in an entire region of the organic layer.

In an exemplary embodiment of a method of forming a wire, the ion doping may be performed by using ion implantation.

The ion implantation, which is a method in which a material to be injected is ionized in a vacuum container and then accelerated by an electric field to be injected into a target material, is performed at a lower temperature than a thermal diffusion process. In the ion implantation, the distribution of the ions can be relatively precisely determined by controlling an injection amount and an acceleration voltage of the injectable material.

When the ions are injected into the photosensitive resin composition included in the organic layer 2200, the injected ions may have constant energy. Accordingly, the bond inside the photosensitive resin composition is broken by the injected ions and is recombined, whereby the color of the photosensitive resin composition is changed. Typically, the photosensitive resin composition having a transparent color becomes dark and opaque by the ion implantation.

In addition, the injected ions also darken and make the color of the photosensitive resin composition less than totally transparent such as being opaque.

As a result, the color of the photosensitive resin composition changes from an original color (e.g., transparent) before the ion implantation to a different color after the ion implantation, such that the organic layer 2200 including the photosensitive resin composition into which ions are implanted becomes opaque. As an example, the organic layer 2200 may be black.

When the organic layer 2200 is colored, the organic layer 2200 can reduce reflection of light by the metal layer 2100 of the wire 2000.

In the display device, the wire 2000 reflects external light introduced to the display device, and such external light reflection deteriorates the display quality of the display device.

Therefore, in order to reduce or effectively prevent the reflection of external light in a conventional display device, a wire portion is shielded with a black matrix or the like. However, when the black matrix is applied in this way, an area at which the light is emitted from the display device is reduced and an aperture ratio of the display device is reduced.

However, in the display device according to one or more exemplary embodiment, the photosensitive resin composition used in the manufacturing process of the display device is not removed from the wire, but is ion-doped to impart a color to the photosensitive resin composition and remains in the wire, thereby reducing the reflectance of the wire. Therefore, the black matrix of the conventional display device can be omitted, and the external light reflection of the wire can be reduced.

In this case, a thickness of the organic layer 2200 may be in a range of about 1 angstrom (Å) to about 10 micrometers (μm). The thickness may be a maximum thickness relative to a reference surface, such as an upper surface of the metal layer 2100. When the thickness of the organic layer 2200 is less than about 1 Å, the organic layer 2200 does not have a substantial light absorption effect to achieve a reduction in light reflection. When the thickness of the organic layer 2200 is more than about 10 μm, the total thickness of the wire 2000 becomes too thick and undesirably increases a thickness of the display device and components thereof.

Figure 2A:
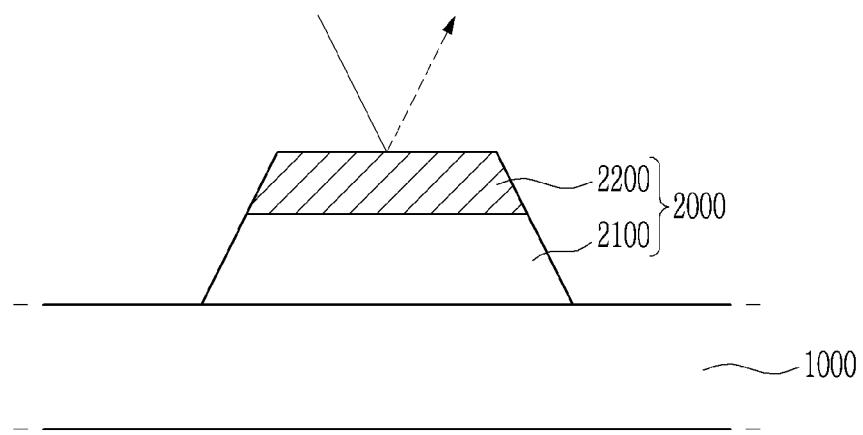
FIG. 2A and FIG. 2B are cross-sectional views to illustrate external light reflection relative to an exemplary embodiment of a wire according to the invention and a wire according to a comparative example.
Figure 2B:
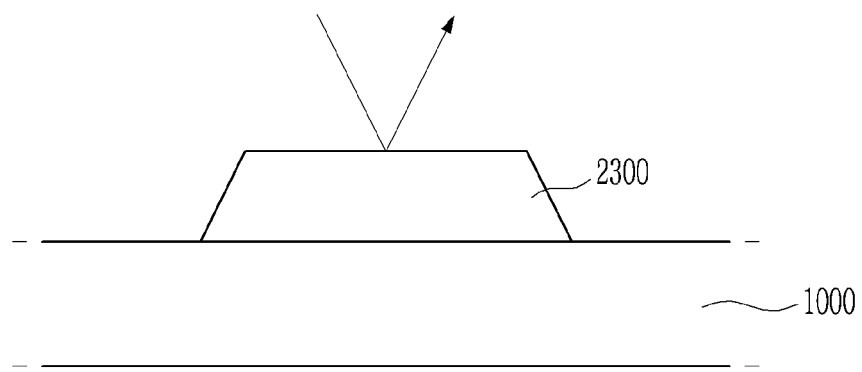

FIG. 2A and FIG. 2B illustrate cross-sectional views of external light reflection by an exemplary embodiment of a wire according to the invention and a wire according to a comparative example.

Referring to FIG. 2B, light is reflected at a surface of a wire 2300 not including an organic layer therein. As indicated by an arrow in FIG. 2B, light introduced to the wire 2300 including or made of a metal material is reflected at the surface of the metal material wire 2300.

However, indicated by the dotted line arrow in to FIG. 2A, the wire 2000 including the colored organic layer 2200 is absorbed by the colored organic layer 2200 without being reflected thereby. In addition, since the metal layer 2100 in the wire having relatively high reflectivity is covered by the organic layer 2200, reflection by the metal layer 2100 does not occur. Therefore, the external light reflection by the wire 2000 can be reduced.

According to another exemplary embodiment, the organic layer 2200 may include nanoparticles and the like. When the organic layer 2200 includes nanoparticles and the like, the color of the organic layer 2200 can be made darker. In this case, the absorption of external light by the organic layer 2200 is relatively large and the reflectance of the wire 2000 can be reduced. In this case, the nanoparticles in the wire may be at least one of silver, titanium, zinc, and copper. However, the invention is not limited thereto, and the nanoparticles may include a metal, a non-metal or a metalloid. A size of such nanoparticles may be in a range of about 1 nanometers (nm) to about 900 nm, and nanoparticles of different constituent materials and/or sizes may be simultaneously included. Alternatively, nanoparticles having a core/shell structure may be included. A shape of these nanoparticles can vary, such as particles, flakes, wires and needles.

In the display device according to one or more exemplary embodiment of the invention, the wire 2000 may be a gate line and/or a data line of the display device. However, the invention is not limited thereto, and the wire 2000 can be applied to any wire or conductive element included in the display device.

Hereinafter, an exemplary embodiment of a wire forming method according to the invention wires will be described.

The wire forming method according to one or more exemplary embodiment includes forming a metal (material) film on a substrate, applying a photosensitive resin (material) composition onto the metal layer, patterning the photosensitive resin composition, forming a patterned metal layer by etching the metal layer with the patterned photosensitive resin composition as a mask, and performing ion doping of the patterned photosensitive resin composition remaining on the patterned metal layer.

Hereinafter, the wire forming method according to one or more exemplary embodiment will be described with the accompanying drawings. FIG. 3A to FIG. 3F are cross-sectional views illustrating an exemplary embodiment of a wire forming method according to the invention.

Figure 3A:
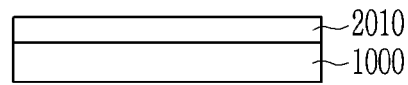
FIG. 3A to FIG. 3F are cross-sectional views illustrating an exemplary embodiment of a method of forming a wire according to the invention.

Referring to FIG. 3A, a metal (material) film 2010 is formed on a substrate 1000. The metal film 2010 may have a single-layered structure or a multi-layered structure. The metal film 2010 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). In addition, the metal film 2010 may include a transparent conductive oxide such as ITO (indium tin oxide), GZO (gallium zinc oxide) and IZO (indium zinc oxide). In an exemplary embodiment, for example, the metal film 2010 may have a multi-layered structure of, e.g., molybdenum/aluminum/molybdenum, titanium/aluminum/titanium, or titanium/copper.

Figure 3B:
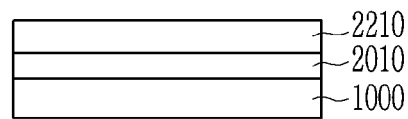

Referring to FIG. 3B, a photosensitive resin (material) composition 2210 is positioned on the metal film 2010. The photosensitive resin composition 2210 may be a positive photosensitive resin composition or a negative photosensitive resin composition. The photosensitive resin composition 2210 may include nanoparticles. The description of the nanoparticles is the same as described above. A detailed description of the same constituent elements is omitted. Similarly, the description of the photosensitive resin composition is the same as that described above, and a detailed description of the same constituent elements is omitted. When the photosensitive resin composition 2210 includes the nanoparticles, the photosensitive resin composition 2210 may have a certain color. However, the originally-formed photosensitive resin composition 2210 is typically transparent (e.g., having little to no color).

Figure 3C:
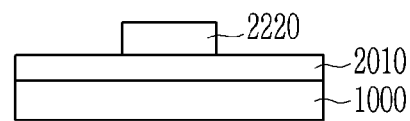

Referring to FIG. 3C, the photosensitive resin composition is patterned to form a patterned photosensitive resin composition 2220. In the exemplary embodiment, the patterned photosensitive resin composition 2220 may be patterned to have a shape of the wire to be finally formed. The shape may include dimensions taken in the plane of the display device or components thereof, e.g., in the first or second direction described above.

Figure 3D:
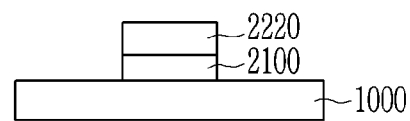

Referring to FIG. 3D, the metal film 2010 is etched with the patterned photosensitive resin composition 2220 used as a mask, to form a patterned metal layer 2100. The patterned metal layer 2100 may have a shape substantially the same as that of the patterned photosensitive resin composition 2220, such as having substantially the same planar dimensions taken in the first or second directions described above.

Figure 3E:
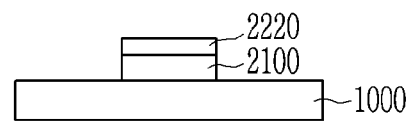

Referring to FIG. 3E, a thickness of the patterned photosensitive resin composition 2220 remaining on the patterned metal layer 2100 is reduced by partially removing the patterned photosensitive resin composition 2220 positioned on the patterned metal layer 2100. However, in an exemplary embodiment, a process of reducing a thickness of the patterned photosensitive resin composition 2220 may be omitted, The operation of FIG. 3E is a process performed when reducing the thickness of the photosensitive resin composition 2220 is desirable for the finally-formed wire. In an exemplary embodiment, the process of reducing the thickness of the patterned photosensitive resin composition 2220 may be omitted when an original thickness of the photosensitive resin composition 2220 is not relatively large.

The thickness of the photosensitive resin composition 2220 represented in FIG. 3E may be in a range of about 1 Å to 10 about μm.

Figure 3F:
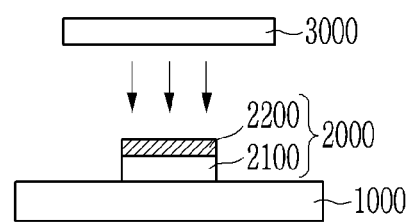

Referring to FIG. 3F, ions may be implanted to the patterned photosensitive resin composition 2220 shown in FIG. 3E, such as by using an ion-implanter 3000. The photosensitive resin composition 2220 to which the ions have been implanted is referred to as an organic layer 2200. Here, the implanted ions may include at least one of phosphorus, boron, antimony, arsenic, gold, iron, copper, lithium, zinc, manganese, magnesium, nickel, sodium, silicon, cobalt, tin, zirconium, and silver ions. However, the invention is not limited thereto, and the implanted ions may include metal, non-metal or metalloid ions.

By such ion implantation, an internal bond of the photosensitive resin composition is broken and re-bonded to change a color of the photosensitive resin composition. Accordingly, the photosensitive resin composition becomes dark and opaque after ion implantation. As an example, the organic layer 2200 may become opaque or black relative to an original color or being transparent.

The opaque or black organic layer 2200 can reduce the reflection of external light incident to the wire 2000. In addition, since the organic layer 2200 covers the metal layer 2100 of the wire 2000 such that an upper surface of the metal layer 2100 is not exposed to external light, reflection by the metal layer 2100 can be reduced or effectively prevented.

As such, according to one or more exemplary embodiment of the invention, the wire manufacturing method does not involve removing a photosensitive resin composition used as a mask in a wire etching process. Instead, the patterned photosensitive resin composition used as the mask remains in the wire as a colored photosensitive resin composition such as by performing the ion doping thereto to reduce reflection of light thereby. Accordingly, suppression of external light reflection of the wire is achieved without an additional manufacturing process. In addition, when such a wire having the light absorbing (e.g., non-reflecting) layer on the conductive metal layer is applied to the display device, a conventional black matrix structure may be omitted to improve an aperture ratio of the display device.

Hereinafter, a display device to which one or more exemplary embodiment of a wire according to the invention is applied will be described. The wire according to the exemplary embodiment may be a conductive line or a signal line of the display device, such as a gate line or a data line, without being limited thereto. In other words, one or more exemplary embodiment according to the invention may be applied any of a conductive wire or a wire having a light-reflecting material included in the display device without restriction.

The display device may display an image with light. The display device may include a display area at which the image is displayed and a non-display area at which the image is not displayed. The display area of the display device may include a pixel area as a light-emitting region or light-transmitting region at which light is emitted/transmitted to display the image, and a non-display region at which light is not emitted/transmitted and the image is not displayed.

The display device may include a display panel which generates and displays the image with light. In addition, a display device including the wire according to one or more exemplary embodiment may be a self-emissive display device such as an organic light emitting diode display or a display device which is not self-emissive such as a liquid crystal display.

The pixel area of the display device and components therein may be operated or controlled to generate and emit light for displaying the image by signals applied thereto through a switching element and wire as a conductive signal line. The signals applied to and through the switching element to the pixel area may include a power signal, a control signal, a driving signal, a gate signal, an (image) data signal, and the like.

Figure 4:
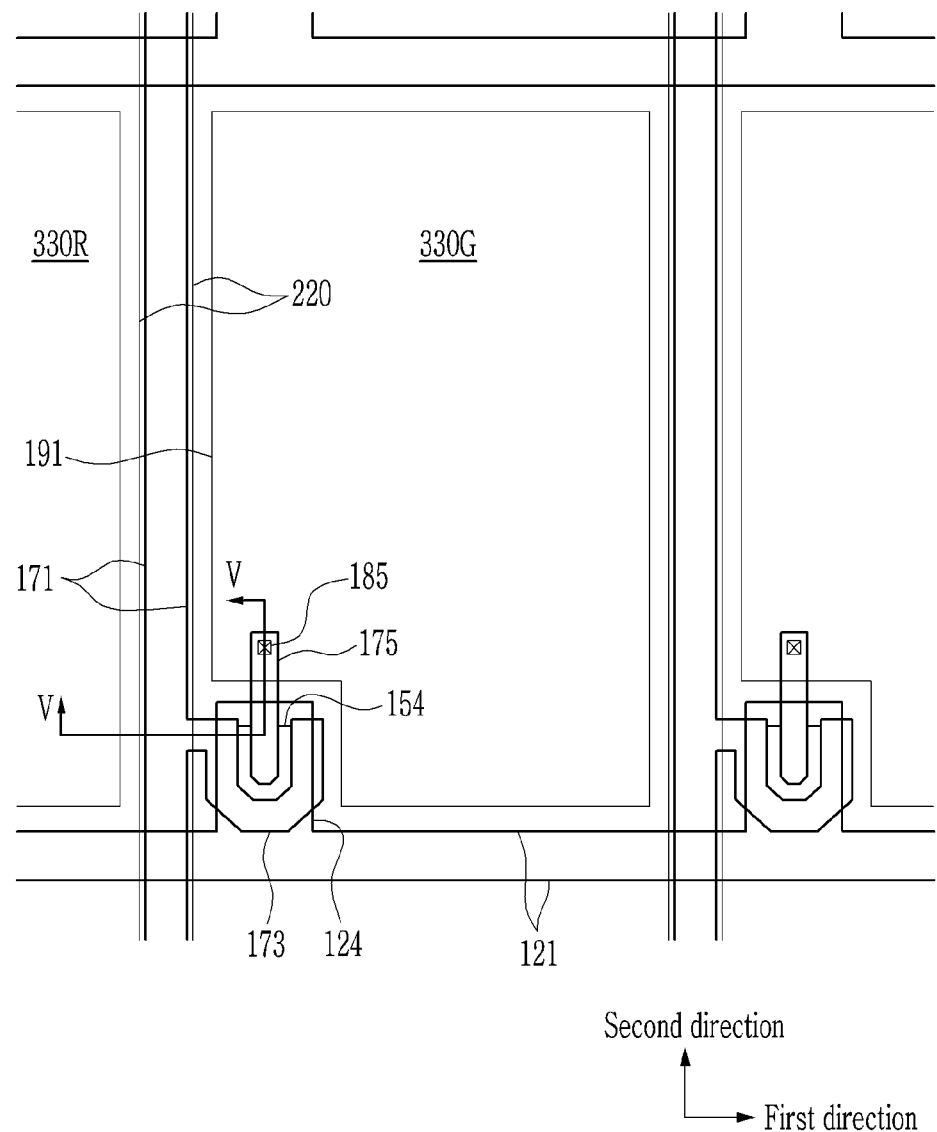
FIG. 4 is a top plan view illustrating an exemplary embodiment of a display device including a wire according to the invention.

Hereinafter, an exemplary embodiment of a display device according to the invention will be described in detail with reference to the accompanying drawings. FIG. 4 is a top plan view illustrating an exemplary embodiment of a display device according to the invention, and FIG. 5 is a cross-sectional view of the display device of FIG. 4 taken along line V-V.

Figure 5:
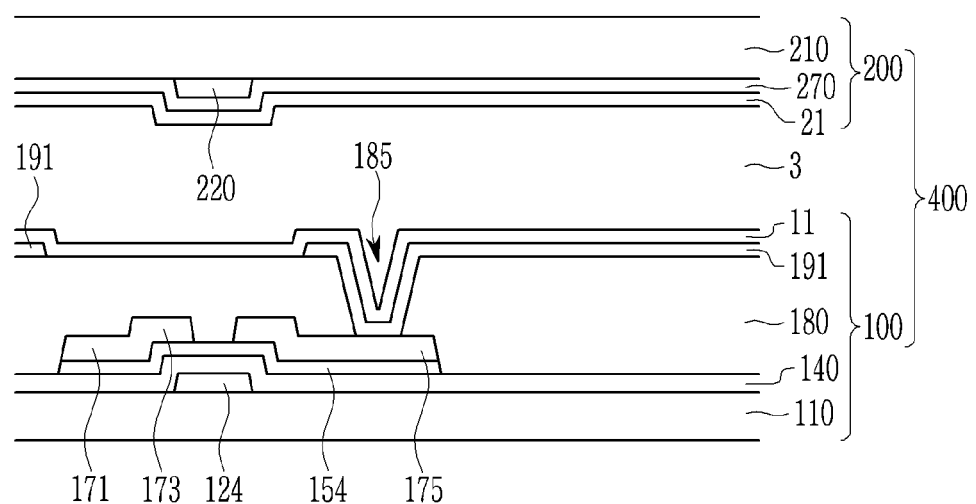
FIG. 5 is a cross-sectional view of the display device of FIG. 4 taken along line V-V.

Referring to FIG. 4 and FIG. 5, a display panel 400 includes a first display (substrate) panel 100, a second display (substrate) panel 200 which overlaps the first display panel 100, and an optical transmittance layer such as a liquid crystal layer 3 positioned between the first display panel 100 and the second display panel 200. The structure of FIG. 4 and FIG. 5 may represent the display area of the display device without being limited thereto.

First, the first display panel 100 will be described. A gate conductor including a gate line 121 and a gate electrode 124 is positioned on a first (base) substrate 110 including or made of, e.g., a transparent glass or plastic.

The gate line 121 may lengthwise extend in a first direction (e.g., horizontal in FIG. 4). The gate conductor may include various metals or conductors, and/or may have a multi-layered structure.

In this case, the gate conductor may be a wire corresponding to one of the aforementioned exemplary embodiments of FIG. 1. Specifically, the gate conductor includes a metal layer and an organic layer which is positioned on the metal layer, and the organic layer may be an ion-doped photosensitive resin composition. Detailed description of the same constituent elements is omitted. As such, when the gate conductor has a structure of a metal layer and an organic layer (e.g., ion-doped photosensitive resin composition), external light reflection at the wire is suppressed by the organic layer.

A gate insulating layer 140 is positioned between the gate conductor and the liquid crystal layer 3. The gate insulating layer 140 may include an inorganic insulating material.

A semiconductor layer 154 is positioned on a surface of the gate insulating layer 140.

A data line 171 is positioned between the semiconductor layer 154 and the liquid crystal layer 3, and lengthwise extends in a second direction (e.g., vertical in FIG. 4) to cross the gate line 121. A source electrode 173 may extend from the data line 171 to overlap the gate electrode 124. The drain electrode 175 may be separated from the data line 171, and may have a rod shape extending toward a center of the source electrode 173 as shown in FIG. 4.

In this case, a data conductor including the data line 171, the source electrode 173 and a drain electrode 175 may each be a wire described in one of the exemplary embodiments of FIG. 1. In other words, the data conductor may include a metal layer and an organic layer which is disposed on the metal layer, and the organic layer may be an ion-doped photosensitive resin composition. Detailed description of the same constituent elements is omitted. As such, when the data conductor has a structure of a metal layer and an organic layer (e.g., ion-doped photosensitive resin composition), external light reflection at the wire is suppressed by the organic layer.

A portion of the semiconductor layer 154 may not overlap the data line 171 and the drain electrode 175 in a non-overlapping region between the source electrode 173 and the drain electrode 175. The semiconductor layer 154 may have substantially a same planar shape as that of the data line 171 and the drain electrode 175 except for this non-overlapping region.

One gate electrode 124, one source electrode 173, and one drain electrode 175 constitute one switching element such as a thin film transistor together with the semiconductor layer 154. A channel of the thin film transistor is a region of the semiconductor layer 154 exposed (e.g., non-overlapping) between the source electrode 173 and the drain electrode 175.

A passivation layer 180 is positioned respectively between the liquid crystal layer 3 and each of the source electrode 173 and drain electrode 175. The passivation layer 180 may include a relatively low dielectric constant insulating material, an organic insulating material and/or an inorganic insulating material such as a silicon nitride or a silicon oxide.

The passivation layer 180 has a contact hole 185 defined therein that overlaps a portion of the drain electrode 175.

A first electrode 191 is positioned between the passivation layer 180 and the liquid crystal layer 3. The first electrode 191 is physically and electrically connected to the drain electrode 175 through and at the contact hole 185 to receive a data voltage from the drain electrode 175. The first electrode 191 may be any of a number of display electrodes such as a pixel electrode with which light transmittance through the liquid crystal layer 3 is controlled to display an image.

Any one of the aforementioned features of the first display panel 100 may be provided in plurality therein.

A first alignment layer 11 is positioned between the first electrode 191 and the liquid crystal layer 3.

The second display panel 200 includes a second (base) substrate 210, a light blocking member 220, a second electrode 270 and a second alignment layer 21.

The second electrode 270 is positioned on a surface of the second substrate 210. The second electrode 270 may be any of a number of display electrodes such as a common electrode with which light transmittance through the liquid crystal layer 3 is controlled to display the image.

The light blocking member 220 is positioned between the second substrate 210 and the second electrode 270. The light blocking member 220 may overlap the data line 171 to lengthwise extend in the second direction along the data line 171. Although not illustrated, the light blocking member may collectively include a horizontal portion that lengthwise extends in the first direction along the gate line 121 to overlap the gate line 121. However, in an exemplary embodiment, the light blocking member 220 may be omitted.

Any one of the aforementioned features of the second display panel 200 may be provided in plurality therein.

The second alignment layer 21 is positioned between the second electrode 270 and the liquid crystal layer 3.

Hereinafter, another exemplary embodiment of a display device according to the invention will be described in detail with reference to FIG. 6. The structure of FIG. 6 may represent the display area of the display device without being limited thereto.

Figure 6:
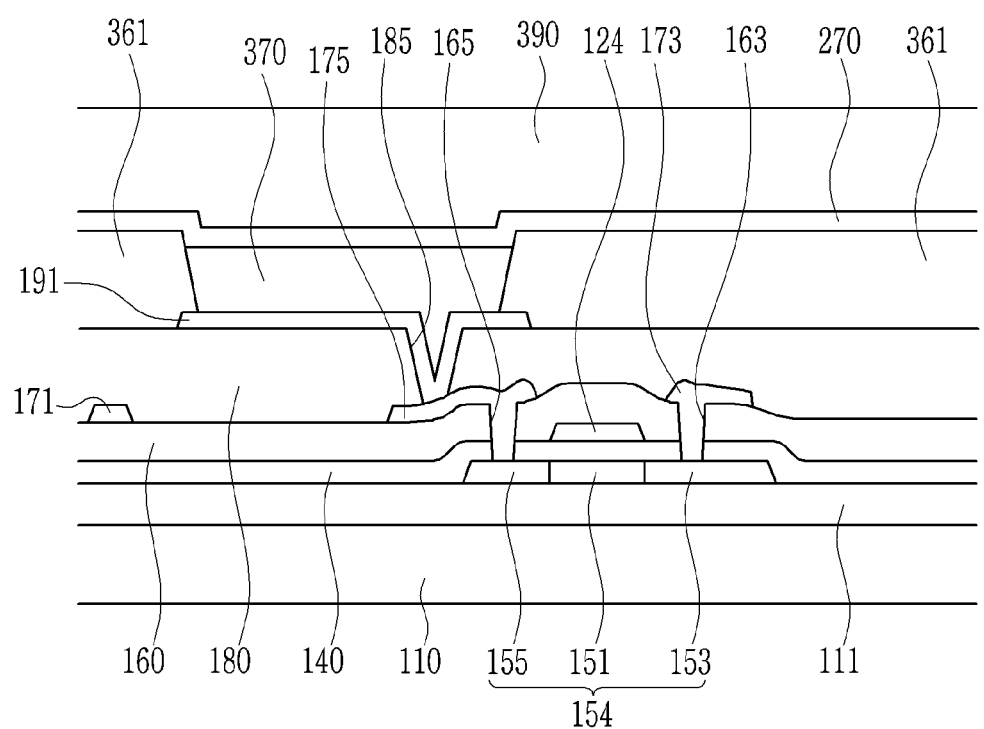
FIG. 6 is a cross-sectional view illustrating another exemplary embodiment of a display device according to the invention.

FIG. 6 is a cross-sectional view illustrating another exemplary embodiment of a display device according to the invention. Referring to FIG. 6, a buffer layer 111 including or made of a silicon oxide, a silicon nitride, or the like is positioned on the first (base) substrate 110.

The semiconductor layer 154 is positioned on the buffer layer 111. The semiconductor layer 154 includes a drain region 155 and a source region 153 doped with p-type impurities, and a channel region 151 positioned between the source region 153 and the drain region 155.

The gate insulating layer 140 may be positioned on the semiconductor layer 154 and the buffer layer 111 to include a silicon oxide or a silicon nitride. The gate electrode 124 overlaps the channel region 151 of the semiconductor layer 154, and is positioned on the gate insulating layer 140.

A gate conductor including the gate electrode 124 may be a wire corresponding to one of the aforementioned exemplary embodiments of FIG. 1. Specifically, the gate conductor includes a metal layer and an organic layer which is positioned on the metal layer, and the organic layer may be an ion-doped photosensitive resin composition. Detailed description of the same constituent elements is omitted. As such, when the gate conductor has a structure of a metal layer and an organic layer (ion-doped photosensitive resin composition), external light reflection at the wire is suppressed by the organic layer.

An interlayer insulating layer 160 is positioned on the gate electrode 124 and the gate insulating layer 140. The interlayer insulating layer 160 has a first contact hole 165 and a second contact hole 163 defined therein.

The data conductor including the data line 171, the source electrode 173, and the drain electrode 175 is disposed on the interlayer insulating layer 160.

In this case, the data conductor may be a wire corresponding to one of the aforementioned exemplary embodiments of FIG. 1. Specifically, the data conductor includes a metal layer and an organic layer which is positioned on the metal layer, and the organic layer may be an ion-doped photosensitive resin composition. Detailed description of the same constituent elements is omitted. As such, when the data conductor has a structure of a metal layer and an organic layer (ion-doped photosensitive resin composition), external light reflection at the wire is suppressed by the organic layer.

The drain electrode 175 is connected with the drain region 155 through and at the first contact hole 165. In addition, the source electrode 173 is connected with the source region 153 through and at the second contact hole 163.

The passivation layer 180 is positioned on the data conductors 171, 173 and 175 and the interlayer insulating layer 160, and the passivation layer 180 has the contact hole 185 defined therein.

The first electrode 191 is disposed on the passivation layer 180. The first electrode 191 may be a pixel electrode. The first electrode 191 is connected with the drain electrode 175 through and at the contact hole 185. A partition wall 361 is positioned on the passivation layer 180. The partition wall 361 may include an opening defined therein as a light-emission region. A light-emitting device layer 370 is positioned to overlap the first electrode 191 at the opening in the partition wall 361. The second electrode 270 is disposed to overlap the light-emitting device layer 370. The second electrode 270 may be a common electrode.

In this case, the first electrode 191 may serve as an anode which is a hole injection electrode, and the second electrode 270 may serve as a cathode which is an electron injection electrode. However, the invention is not limited thereto. The first electrode 191 may serve as the cathode and the second electrode 270 may serve as the anode, depending on a driving method of the display device.

The light-emitting device layer 370 may include an emission layer, an electron transport layer, a hole transport layer, and the like.

An encapsulation layer 390 is positioned to the second electrode 270. The encapsulation layer 390 may include an organic material or an inorganic material, which may be alternately stacked. The encapsulation layer 390 may protect the display from external moisture, heat, and other contaminants.

As described above, in the display device according to one or more exemplary embodiment of the invention, conductive signal lines such as the gate line or the data line includes a metal layer and an organic layer which is positioned on the metal layer, and the organic layer may be an ion-doped photosensitive resin composition. The organic layer absorbs external light incident thereto such as by having an opaque color, e.g., black. Thus, the external light reflection by a conductive wire may be reduced by ion doping in which a photosensitive resin composition used as a mask in the wire forming process remains as a portion of the conductive wire.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a thin film transistor to which signals are provided for displaying an image, the thin film transistor including a semiconductor layer, a data signal line and a gate signal line; and
   a first electrode connected to the thin film transistor,
   wherein one signal line among the data signal line and the gate signal line in the thin film transistor includes:
      a metal layer, and
      an organic layer having a color within the one signal line, disposed on the metal layer,
   wherein
      the organic layer within the one signal line is an ion-doped pattern of a photosensitive resin material, and
      ion-doping of the photosensitive resin material defines the color of the organic layer within the one signal line.

2. The display device of claim 1, wherein doped ions of the organic layer within the one signal line include at least one of phosphorous, boron, antimony, arsenic, gold, iron, copper, lithium, zinc, manganese, magnesium, nickel, sodium, silicon, cobalt, tin, zirconium and silver ions.

3. The display device of claim 1, wherein a thickness of the organic layer within the one signal line is in a range of about 1 angstrom to about 10 micrometers.

4. The display device of claim 1, wherein the organic layer within the one signal line has an opaque color.

5. The display device of claim 1, wherein the organic layer within the one signal line has a black color.

6. The display device of claim 1, wherein a concentration of doped ions of the organic layer within the one signal line is different in an entire region of the organic layer.

7. The display device of claim 1, wherein the ion-doped photosensitive resin material of the organic layer within the one signal line includes nanoparticles.

8. The display device of claim 1, further comprising:
   a first display substrate in which are disposed the first electrode and the thin film transistor including the one signal line including the metal layer and the organic layer thereon;
   a second display substrate facing the first display substrate;
   a second electrode in the second display substrate; and
   a liquid crystal layer between the first electrode and the second electrode.

9. The display device of claim 1, further comprising a first substrate on which are disposed:
   the thin film transistor including the one signal line including the metal layer and the organic layer thereon;
   the first electrode connected to the thin film transistor;
   an emission layer on the first electrode; and
   a second electrode overlapping the first electrode with the emission layer therebetween.

* * * * *